US005543747A

United States Patent [19]

[11] Patent Number: 5,543,747

Hayakawa et al.

[45] Date of Patent: Aug. 6, 1996

[54] BIPOLAR INTEGRATED DEVICE HAVING PARASITIC CURRENT DETECTOR

[75] Inventors: Junji Hayakawa, Okazaki; Hiroyuki Ban, Hazu-gun, both of Japan

[73] Assignee: Nippondenso Co., Ltd., Kariya, Japan

[21] Appl. No.: 363,778

[22] Filed: Dec. 27, 1994

[30] Foreign Application Priority Data

Dec. 27, 1993 [JP] Japan ........ 5-350420

[51] Int. Cl.[6] ........ H01L 25/00

[52] U.S. Cl. ........ 327/565; 327/314; 327/110

[58] Field of Search ........ 327/564–565, 327/314, 110

[56] References Cited

U.S. PATENT DOCUMENTS

| | | | |
|---|---|---|---|
| 4,310,792 | 1/1982 | Iwatani et al. | 327/564 |
| 4,322,770 | 3/1982 | Sendelweck | 327/564 |

FOREIGN PATENT DOCUMENTS 467787 10/1992 Japan .

OTHER PUBLICATIONS

Yanai Hisayoshi, Section of Process Device Technique, Integrated Circuit Engineering (1), Aug. 30, 1980, published by Corona Corp., pp. 165–168.

*Primary Examiner*—Margaret R. Wambach
*Attorney, Agent, or Firm*—Cushman, Darby & Cushman

[57] ABSTRACT

A bipolar semiconductor integrated circuit for driving a motor and the like wherein a semiconductor pattern and a circuit are so contrived that an erroneous operation will not take place even when a negative potential is applied to the output terminal of the circuit. When a negative potential is applied, there exists a quantitative proportional relationship between a parasitic current of a parasitic transistor and a ratio of the lengths of the collectors. The parasitic current decreases with a decrease in the length of the collector. Therefore, the short side of a transistor in the control circuit is directed to the output transistor to which a negative potential will be applied. By detecting the parasitic current and by adding a current to the constant-current using a current mirror circuit, furthermore, erroneous operation due to parasitism can be completely prevented.

15 Claims, 9 Drawing Sheets

BIPOLAR INTEGRATED DEVICE HAVING PARASITIC CURRENT DETECTOR

BACKGROUND OF THE INVENTION

1. Field of the Invention

The present invention relates to a bipolar semiconductor integrated circuit having an improved element layout pattern and an improved circuit constitution.

2. Description of the Related Art

In bipolar semiconductor integrated circuits in which the individual elements are isolated by PN-junctions, a PNP- or an NPN-junction region is developed between a transistor and an adjacent transistor. When equivalently viewed, therefore, the integrated circuit containing a transistor formed of an isolation region and of parts of elements on both sides thereof. Depending upon the voltage applied to the circuit, therefore, there appears a parasitic element, such as a parasitic transistor, which gives rise to the operation of the occurrence of a parasitic effect which is detrimental to the semiconductor circuit.

Japanese Examined Patent Publication (Kokoku) No. 4-67787 discloses a bipolar integrated circuit in which the active elements are isolated by a PN-junction, and wherein an output-stage transistor is disposed on one side and a control transistor is disposed on the other side with a current-feeding transistor that feeds current to the output-stage transistor sandwiched therebetween without increasing the chip area of the semiconductor integrated circuit. The interposed current-feeding transistor helps suppress the parasitic effect caused by a parasitic element that appears between the control transistor and the output-stage transistor.

However, when a negative potential is applied to the output-stage transistor, such as when a load is being driven by a motor, the parasitic effect is not sufficiently decreased depending upon the patterned arrangement of the output-stage transistor, current-feeding transistor and control circuit transistor formed on the semiconductor. The can result in the occurrence of erroneous operation.

FIG. 12 illustrates changes in a motor terminal voltage (VM) and in a motor current (IM) with the passage of time of as a DC motor is driven. A negative current is generated when the motor that was running comes to a halt and a corresponding negative voltage is generated across the output-stage transistor. The negative current can be several hundred milliamperes in the case of a motor mounted on a vehicle. In such a case, erroneous operation is likely to take place as described above.

The object of the present invention is, therefore, to suppress the parasitic effect and to eliminate erroneous operation even when a negative potential is applied such as when a load is being driven a motor controlled by a bipolar semiconductor integrated circuit.

SUMMARY OF THE INVENTION

In order to solve the above-mentioned problem, the present invention basically employs the constitutions mentioned below.

A bipolar semiconductor integrated circuit comprises an output circuit portion having output-stage transistors and a control circuit portion having control transistors for controlling the output circuit portion formed on an integrated circuit chip. According to the present invention, parasitic currents generated by the control transistors can be decreased by simply manipulating the arrangement of the transistors. The optimum arragnement is achieved by understanding that parasitic currents vary in proportion to the collectors length of the control transistors opposite to the output-stage transistors to which a negative potential is applied. Erroneous operation can be avoided by supplying a current to the circuit that is larger than the derived parasitic current.

A feature of the present invention is that the control circuit transistors formed in an elongated shape all have their short sides opposite to the output transistors. Among the control transistors having an elongated shape, even a single control transistor of which the long side is opposite to the output transistor permits a large parasitic current to flow, thereby increasing the probability of erroneous operation. If this transistor erroneously operates, the circuit erroneously operates as a whole. The arrangement of the present invention therefore reduces such a possibility.

In a semiconductor integrated circuit according to another constitution of the present invention, at least three sides of the output-stage transistors are surrounded by an N-type epitaxial layer that is grounded. By operating the epitaxial layer as the collector of the parasitic transistor, the parasitic currents generated by the control transistors can be further decreased.

According to another embodiment of the present invention, the control circuit includes an NPN transistor configured as a capacitor by utilizing the PN-junction capacity between the base and emitter thereof. A constant current is fed to the emitter of the NAN transistor, and the base and collector are connected together and to ground potential. According to this embodiment, even when a parasitic transistor is formed upon the application of a negative potential to the output transistor, an offsetting current is simply drawn from the collector of the grounded NPN transistor, and erroneaous operation of the circuit is prevented.

In the bipolar semiconductor integrated circuit according to a further embodiment of the present invention, the output circuit portion includes current-feeding transistors for feeding currents to the output-stage transistors, the emitters and collectors of said transistors being connected together According to this constitution, the output-stage transistors and the current-feeding transistors prevented from being simultaneously turned on due to a delay time determined by the capacitor, further preventing excess heat being generated by the simultaneous operation of the transistors.

According to a still further embodiment of the present invention, a parasitic current detection means is provided for detecting parasitic currents generated between the output transistors and the control transistors, and for feeding a current corresponding to the parasitic current to the output side of either the collectors or the emitters of the control transistors in order to cancel the parasitic current. The parasitic current is further suppressed by providing an N-type epitaxial layer having a width which is equal to the width of the control transistors, i.e., equal to the length of the collectors thereof that are opposite to the output-stage transistors, and by feeding a current detected through the N-type epitaxial layer to the control transistors through a current mirror circuit. According to this constitution, a current corresponding to the parasitic current generated by the control transistor is detected through the epitaxial layer and is fed through the current mirror circuit to the control transistor. The output-stage transistors are controlled by directly detecting the parasitic current and removing the adverse affect to the output-stage transistor.

DETAILED DESCRIPTION OF THE PREFERRED EMBODIMENTS

Figure 1:
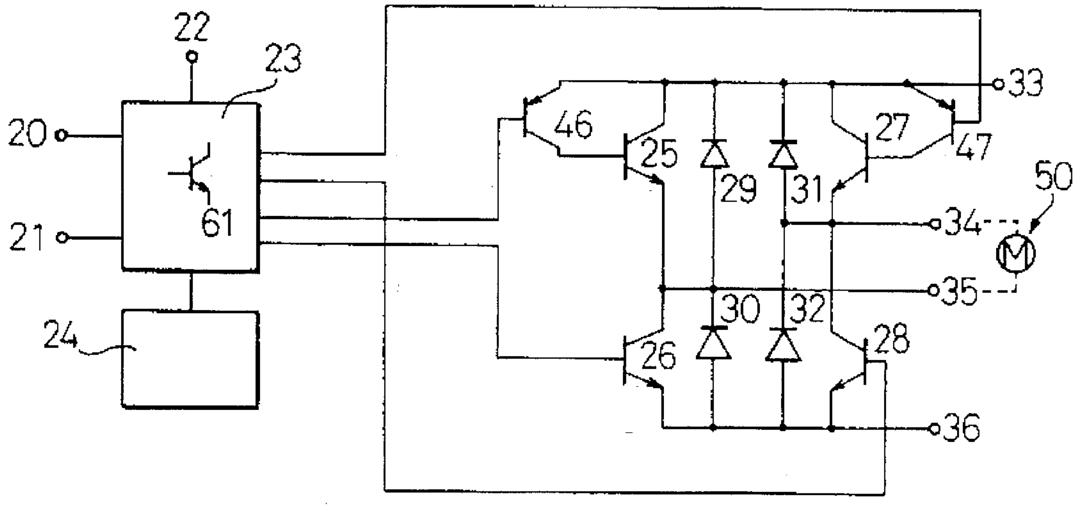
FIG. 1 is a block diagram illustrating a reversible motor driver circuit.

Embodiments of the present invention will now be described with reference to the drawings. FIG. 1 illustrates a circuit for driving a reversible motor, wherein reference numeral 23 denotes a control circuit, 20 and 21 denote signal input terminals, 22 denotes a power source input terminal for the control circuit, 24 denotes an accessory heat cut-off circuit or the like circuit, and the control circuit 23 includes individual elements such as a transistor 61 and the like. On the output side of the control circuit 23 is shown an output circuit containing a combination of transistors and diodes.

In the output circuit, reference numerals 25 and 27 denote current-feeding NPN transistors, and 46 and 47 denote PNP transistors for driving the above transistors. Reference numerals 26 and 28 denote current-absorbing NPN transistors which serve as so-called output-stage transistors. Reference numeral 33 denotes a power source input terminal for feeding electric power to the NPN transistors 25 and 27, reference numerals 29, 30, 31 and 32 denote output-clamping diodes, and 34 and 35 denote output terminals. To the output terminals 34 and 35 are connected a DC motor 50 which is an output load. A terminal 36 is a ground terminal (OV). Depending upon the states of the signal input terminals 20 and 21, the motor 50 is so controlled as to run forward or reverse or to come to a halt.

Figure 2:
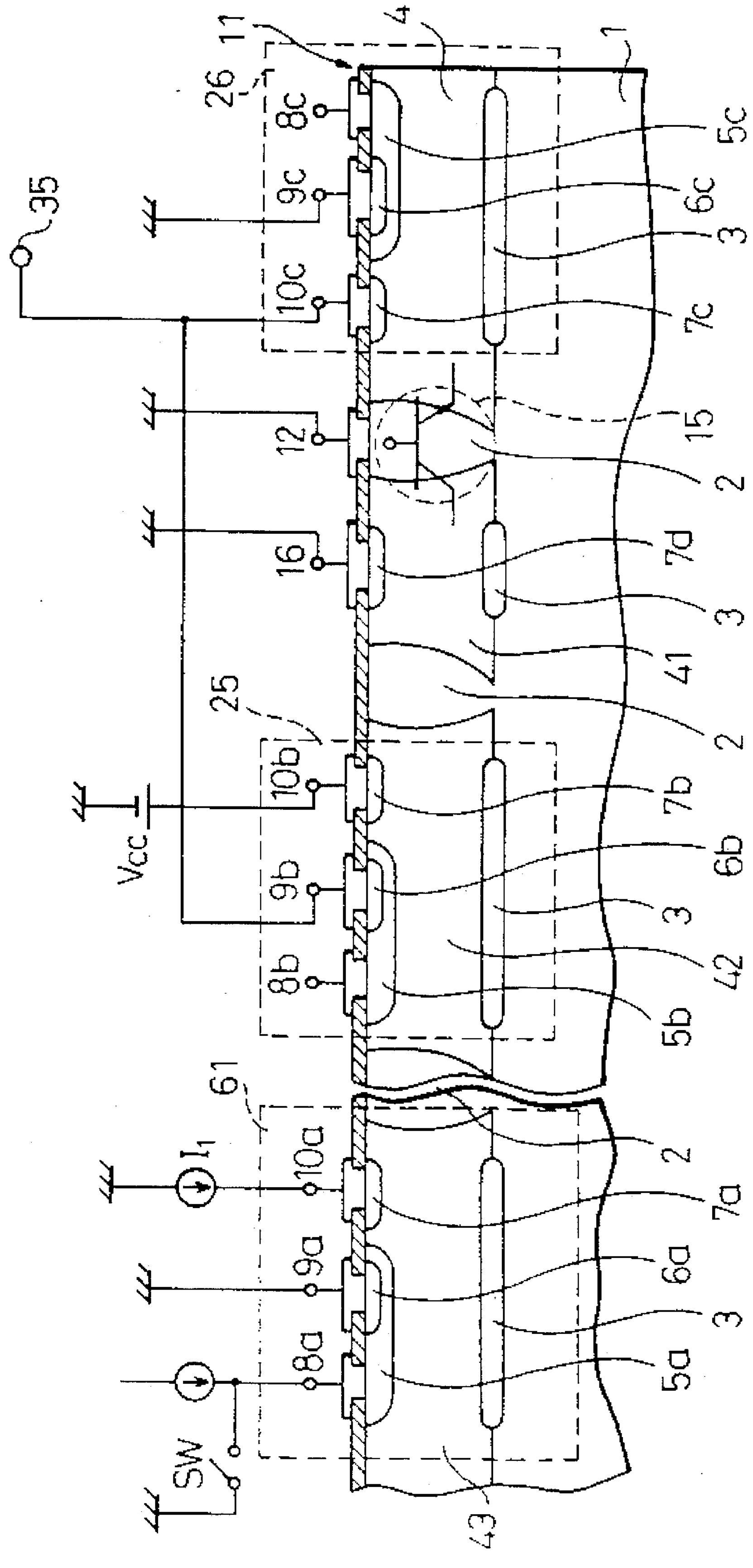
FIG. 2 is a diagram illustrating in cross section the constitution of a bipolar semiconductor integrated circuit representing the feature of the present invention.

FIG. 2 is a diagram which schematically illustrates in cross section the constitution of a bipolar semiconductor integrated circuit of FIG. 1,and shows the output-stage transistor 26, current-feeding NPN transistor 25 and control circuit transistor. A buried layer 3 is formed in a P-type substrate 1 of silicon, and N-type epitaxial layers 4, 41, 42 and 43 are formed thereon, being isolated by an isolation layer 2 formed by P-type diffusion. In the upper portions of the N-type epitaxial layers are formed bases 5*a* to 5*c* by P+-diffusion, emitters 6*a* to 6*c* by N+-diffusion, and collectors 7*a* to 7*d* by N+-diffusion.

Base terminals 8*a* to 8*c* are ohmically connected to the bases 5*a* to 5*c*, respectively emitter terminals 9*a* to 9*c* are ohmically connected to the emitters 6*a* to 6*c*, respectively and collector terminals 10*a* to 10*c* are ohmically connected to the collectors 7*a* to 7*c*, respectively. Hatched regions such as that designated by reference numberal designated 11, represent terminals are composed of an oxide film.

The epitaxial layer 41 sandwiched by isolation layers 2 is disposed between the output-stage transistor 26 and the current-feeding transistor 25, and a GND terminal 12 is connected to the epitaxial layer 41 via the N+-diffusion region 7*d*. Here, the epitaxial layer 41 may be wired to Vcc instead of being connected to GND terminal. The transistor 61 included in the control circuit 23 in FIG. 2 is disposed on a side opposite to the current-feeding transistor 25 and the output-stage transistor 26.

Figure 12:
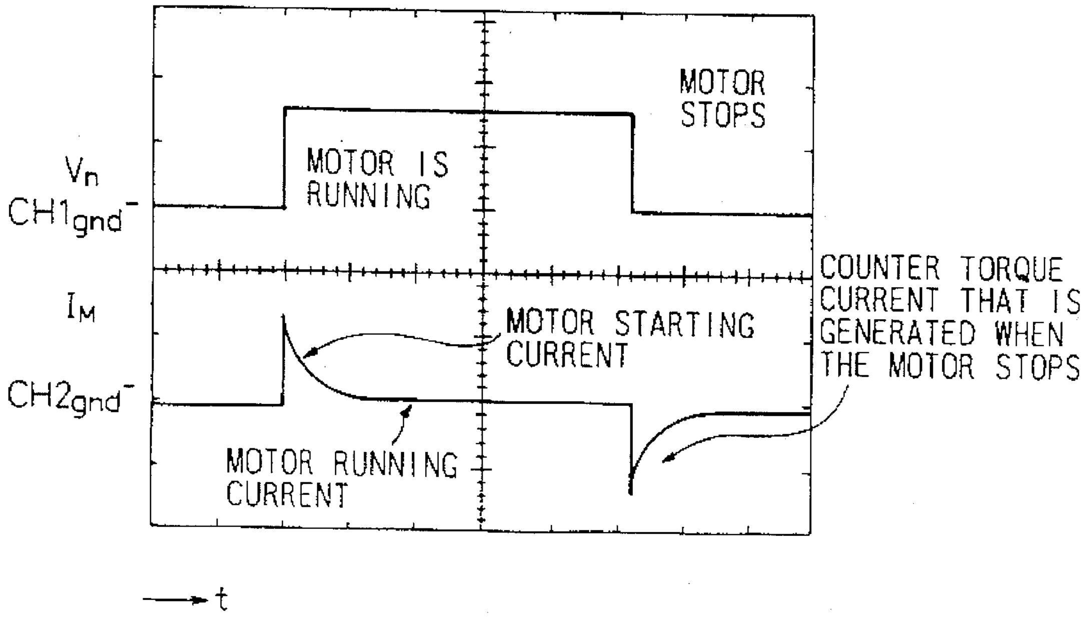
FIG. 12 is a diagram illustrating changes in the motor terminal voltage and in the motor current of when the motor is being driven.

When a negative voltage, as shown in FIG. 12, is applied to the output terminal 35 that connects the emitter 6b of the transistor 25 together with the collector 7*c* of the transistor 26 through aluminum wiring, there occurs a parasitic NPN transistor 15 in which the collector region 4 of the output transistor 26 works as an emitter, the isolation layer 2 works as a base and the epitaxial layer 41 works as a collector as described in the description of prior art. Though the current amplification factor $h_{FE}$ of the transistor 15 is usually small, an increased current flows out from the epitaxial layer 41 with an increase in the negative voltage applied to the output terminal 35.

Figure 3:
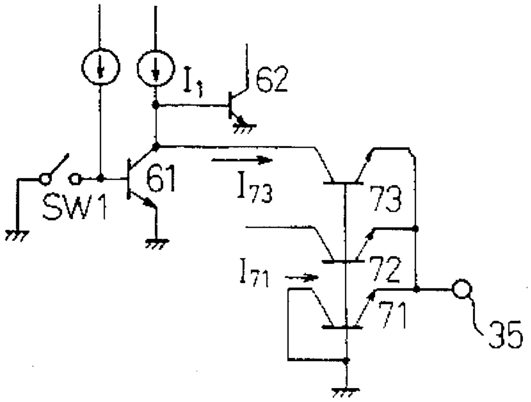
FIG. 3 is a diagram of an equivalent circuit giving attention to the parasitic transistor of FIG. 2.

The above-mentioned parasitic transistor 15 has a lateral structure and, hence, its collector is connected as a multi-collector to the collector of the transistor 25 and to the collectors of other elements on the chip, such as the transistor 61, that constitute the control circuit. As the negative voltage applied to the output terminal 35 increases, therefore, an increased current is drawn from the control circuit element thus giving rise to the occurrence of erroneous operation. FIG. 3 is a diagram of an equivalent circuit illustrating the constitution of the parasitic transistor and wherein the base of a transistor 62 is connected to the collector of the transistor 61 which serves as an input stage to the transistor 62. The transistors 61 and 62 constitute a logic circuit in the control circuit, and reference numerals 71 to 73 denote parasitic transistors that are shown as equivalent circuits.

The parasitic transistor 15 shown in FIG. 2 is the parasitic transistor 71 that is shown in FIG. 3, and is equivalent to a diode with its collector and base short-circuited.

A parasitic transistor connected to the collector of the transistor 25 of FIG. 2 is the one designated at 72, and has its base and emitter in common with those of the parasitic transistor 71. A parasitic transistor connected to the collector of the transistor 61 in the control circuit is designated at 73. The transistor 61 is driven at its base by sw1, changes its collector potential depending upon a constant-current source $I_1$, and drives the base of the transistor 62 of the next stage.

In the above-mentioned constitution, when a negative voltage is applied to the output terminal 35, not only is a current drawn from the common emitter of the parasitic transistors 71 to 73, but also even from the collectors of other NPN transistors on the integrated circuit chip due to the current mirror operation. Depending upon the negative potential, therefore, the collector current 173 of the parasitic transistor 73 becomes greater than that of the constant-current source $I_1$, and the base current is not fed to the next stage when the transistor 61 is turned off; i.e., the transistor 62 fails to properly operate, and the semiconductor integrated circuit constituting the whole circuit operates erroneously.

Figure 4:
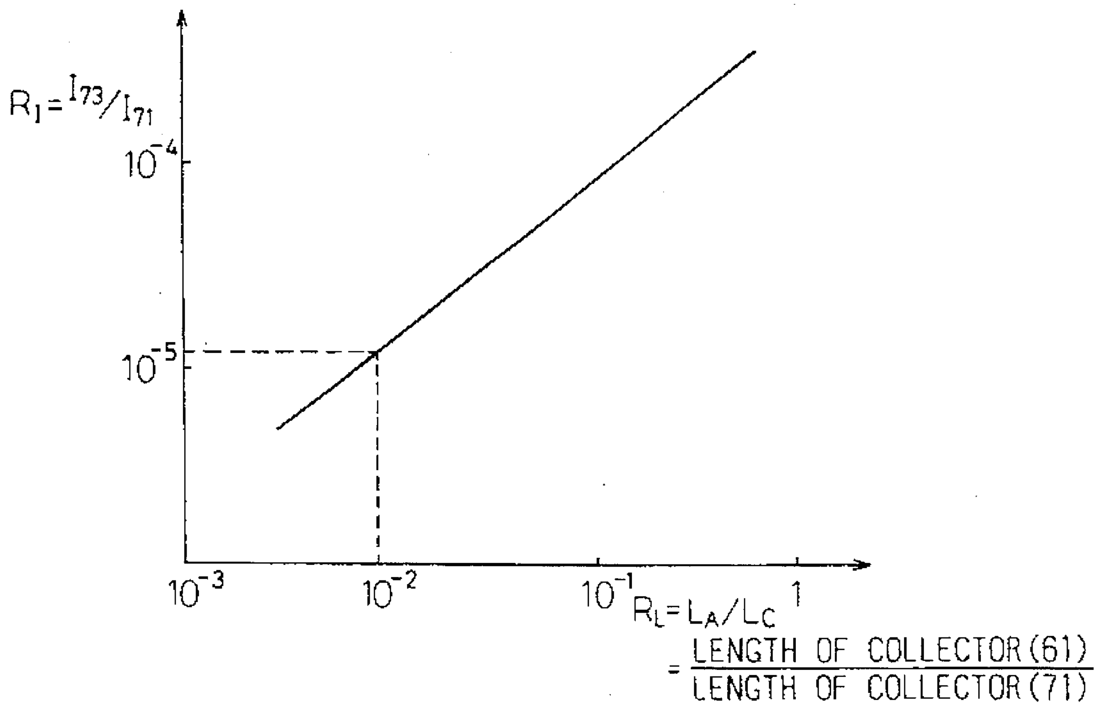
FIG. 4 is a graph illustrating a relationship between the length of the collector and the parasitic current in a plane pattern of a transistor taking part in the parasitism.
Figure 5:
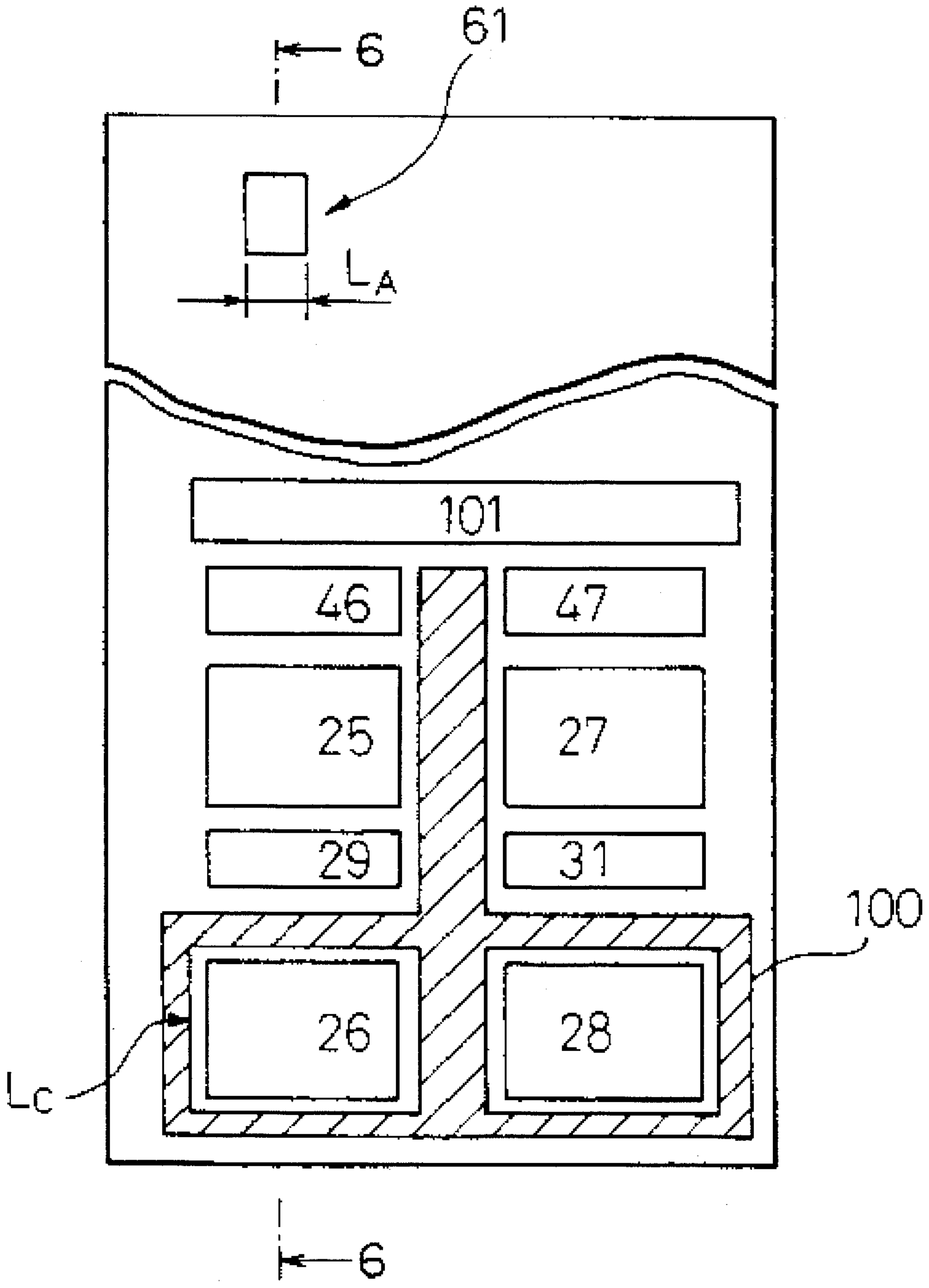
FIG. 5 is a diagram illustrating a plane pattern of an output-stage circuit and part of a control circuit of FIG. 1 representing a feature of the present invention.

According to the present invention, it was found that the parasitic current due to a current drawn from the output terminal 35 of when a negative voltage is applied to the output terminal 35 has a proportional relationship to the length of the collectors (N-type collector regions of NPN transistors) that constitute the parasitic transistors, as quantitatively shown in FIG. 4. In FIG. 4, the abscissa a ratio $R_L$ of lengths of the collectors on the plane pattern, i.e., represents a ratio of the length $L_A$ of the collector of the transistor 61 to the length $L_c$ of the epitaxial layer region 100 surrounding the output-stage transistor 26. Epitaxial layer region is shown in FIG. 5 which illustrates the plane pattern of the output-stage circuit and part of the control circuit of FIG. 1. The ordinate $R_I$ represents a ratio of the parasitic current $I_{73}$ of the transistor 61 to the parasitic current $I_{71}$ due to the epitaxial layer region 100.

It is considered that the current density is nearly equal in the direction of cross section via the base of the P-diffusion isolation layer and, hence, the current increases proportionally to the sectional area between the collector and the emitter of the lateral NPN transistor. Here, since the direction of depth is the same in all devices, there exists a proportional relationship between the sectional area and the length. Referring to FIG. 3, for instance, when a ratio of the length of the collector of the parasitic transistor 71 (transistor 15 in FIG. 2) to the length of the collector of the parasitic transistor 73 is 1/100, it became obvious that the ratio of the current $I_{71}$ that is drawn to the parasitic collector current $I_{73}$ becomes about $10^{-5}$. When, for instance, $I_{71}$ is 0.3 A, $I_{73}$ becomes about 3 μA.

Owing to the above-mentioned quantitative relationship, if the current generated by the application of a negative potential to the output terminal 35 is determined then, the parasitic current $I_{73}$ becomes obvious. If a constant current $I_1$ in the control circuit shown in FIG. 3 is set to be $I_1 - I_{73} > Icmin$ (Icmin is a current necessary for driving the transistor 62), then, a current I, can be maintained which is large enough to drive the transistor 62 of the next stage. Thus, there can be provided a favorable semiconductor integrated circuit that does not erroneously operate even when a negative potential is applied thereto.

FIG. 5 is a plane layout pattern on the semiconductor chip concretely illustrating the arrangement of the elements of FIG. 1. The transistors 25 to 28, 46, 47 and diodes 29, 31 correspond to the elements denoted by the same reference numerals in FIG. 1. Reference numerals 100 and 101 denote N-type epitaxial layer regions. The circuit blocks 23 and 24 of FIG. 1 are arranged on the upper surface or on the right and left surfaces outside the N-type epitaxial layer regions 100 and 101, and are not shown in FIG. 5. Here, $R_L$ (ratio of lengths of collectors) represents a ratio of the length $L_c$ of the N-type epitaxial layer 100 surrounding the transistor 26 to the length $L_A$ of the collector of the transistor 61 in the control circuit.

With the output transistor being surrounded by the N-type epitaxial layer region 100 as described above, the ratio of the parasitic collector current of the parasitic transistor 71 shown in FIG. 3 is increased and, hence, the ratio of the parasitic collector currents of the parasitic transistors 72 and 73 that cause erroneous operation is decreased.

Though the effect of the present invention can be obtained by the above-mentioned constitution, the parasitic current can be further decreased in a manner as described below according to another feature of the present invention. That is, the circuit blocks 23 and 24 arranged on the chip include at least one or more transistors 61 of which the collectors are connected to the constant-current source, and short sides of the elongated plane pattern of the transistors 61 are directed to the output transistors 26 and 28.

With the short sides of the plane pattern of the transistors 61 being directed to the output transistors 26 and 28, the numerator of the ratio of the lengths represented by the abscissa in FIG. 4 can be decreased from a long side to a short side of the transistor 61. Generally, the length ratio of the long side to the short side is about 3 to 2. It is thus made possible to decrease the ratio of parasitic currents represented by the ordinate. By arranging the transistors constituting the control circuit in such a manner that their short sides are favorably oriented toward the output transistors, the parasitic current that flows when a negative potential is applied to the output can be decreased. Accordingly, the arrangement shown in FIG. 5 suppresses the occurrence of erroneous circuit operation.

Since the parasitic current is determined by the load condition and pattern layout of the circuit by supplying of a control current larger than the parasitic current it is possible to completely prevent the occurrence of erroneous operation caused by parasitism.

In FIG. 5, the transistors 61 are disposed over the output transistors 26 and 28, and are directed as shown. When the transistors 61 are arranged on the right and left sides of the output transistors 26 and 28, the transistors 61 are turned by 90 degrees from the shown positions, so that the short sides $L_A$ are directed to the sides of the output transistors 26 and 28. When the transistors 61 are arranged over the output transistors 26 and 28 at an angle of 45 degree or more with respect thereto, the transistors 61 are directed as shown in FIG. 5. Alternatively, they are turned by 90 degrees from the position shown in FIG. 5 when they are lower than the direction of 45 degrees, i.e., in the latter case.

Among the transistors formed in the control circuit 23 of the present invention, it is essential that the transistors formed in an elongated shape all have their short sides directed to the output transistors.

Figure 6:
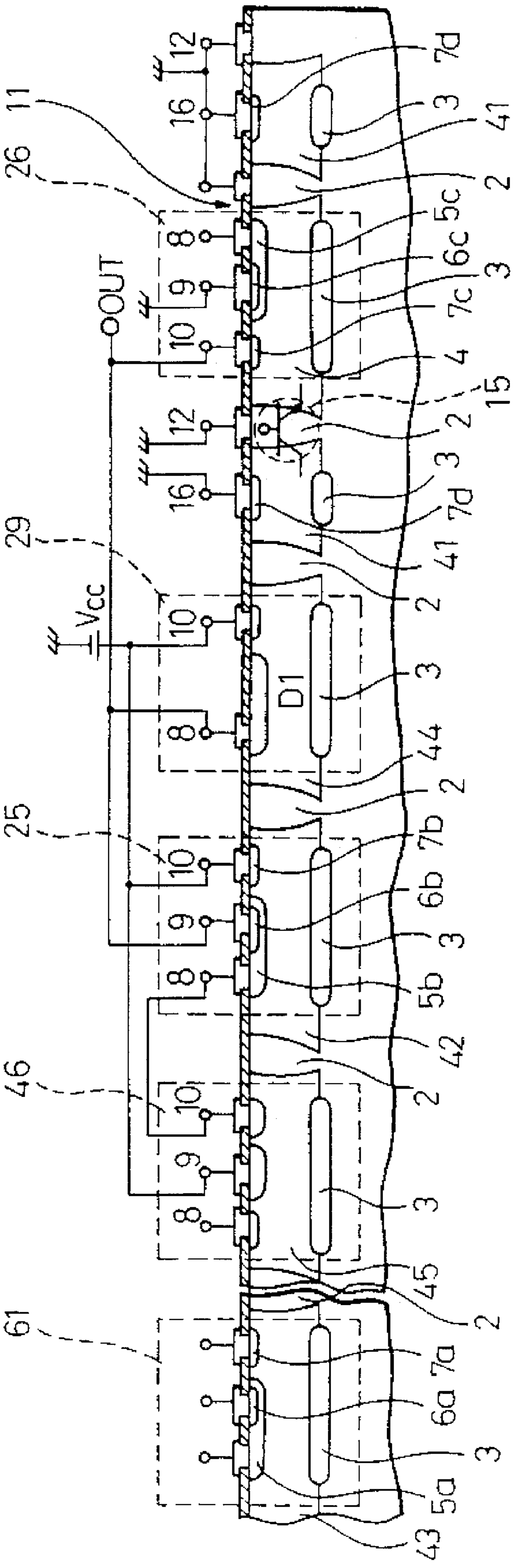
FIG. 6 is a diagram illustrating in cross section the constitution across the plane 6—6 of FIG. 5.

FIG. 6 concretely illustrates the structure and wirings along the cross section 6—6 of FIG. 5. Here, the cross section of the epitaxial layer region 101 is not shown. In FIG. 6, the same elements as those of FIG. 2 are denoted by the same reference numerals. Blocks 26, 29, 25, 46 and 61 indicated by broken lines correspond to those of the same reference numerals shown in FIG. 1. This figure illustrates the cross-sectional arrangement and the wiring method of the circuit shown in FIG. 5.

Figure 7:
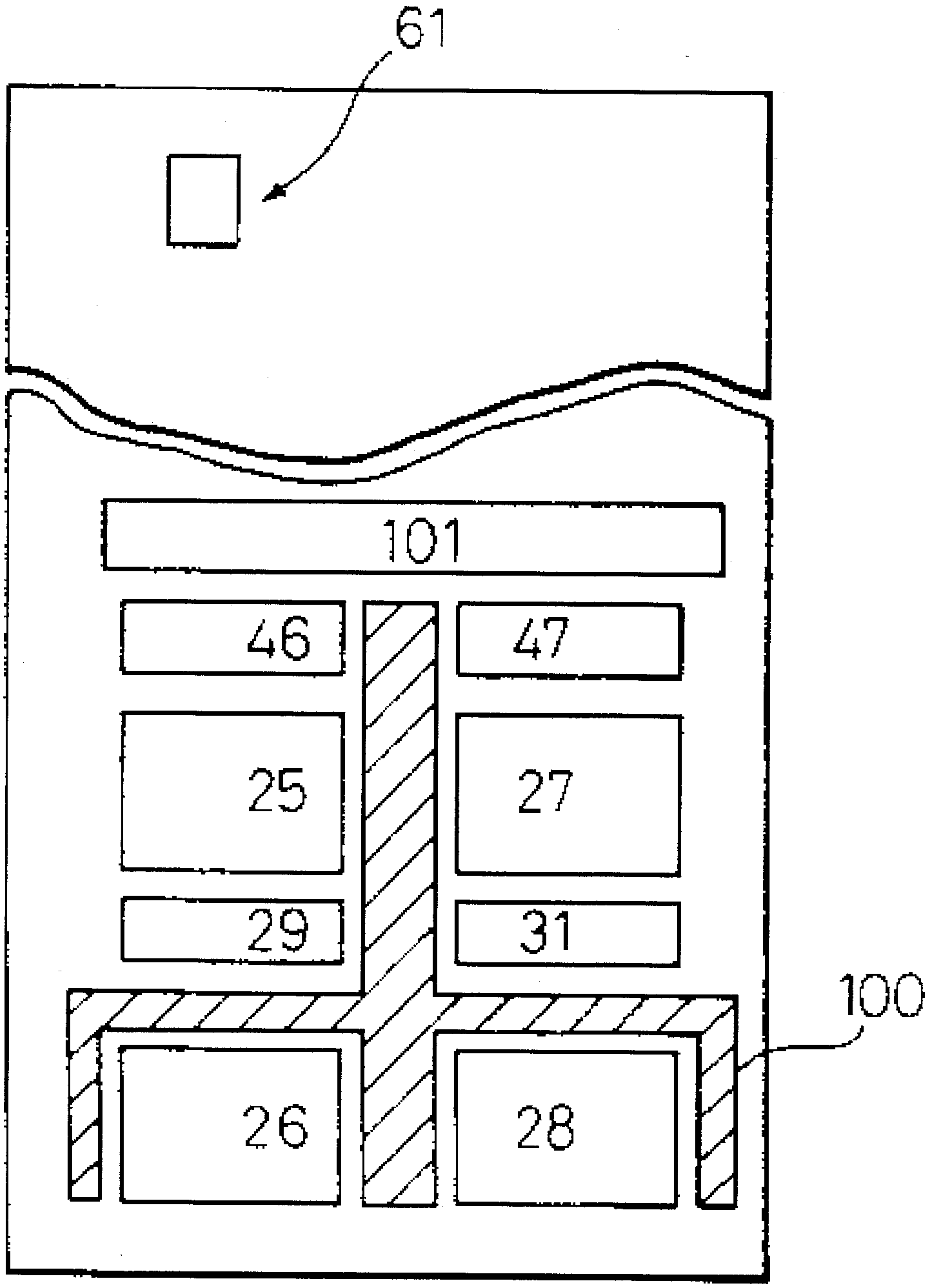
FIG. 7 is a diagram illustrating a plane pattern according to another embodiment of the present invention.

FIG. 7 illustrates another embodiment of FIG. 5. When the lower side of the output-stage transistors 26 and 28 is a dicing surface, for example there exists no element that develops parasitic effect on the lower side. Therefore, the output-stage transistors are surrounded only in the upper, right and left three directions.

According to the above-mentioned embodiment, when the epitaxial layer region is disposed in at least three directions of the output-stage transistors without increasing the chip size of the bipolar semiconductor integrated circuit, the short side of at least one transistor constituting the circuit is directed to the output-stage transistor, and the current of the constant-current portion in the control circuit is set to be larger than the parasitic current. Therefore, the parasitic effect due to the parasitic element appearing on the semiconductor integrated circuit is effectively decreased and there is provided a favorable semiconductor integrated circuit that does not operate erroneously.

Figure 8:
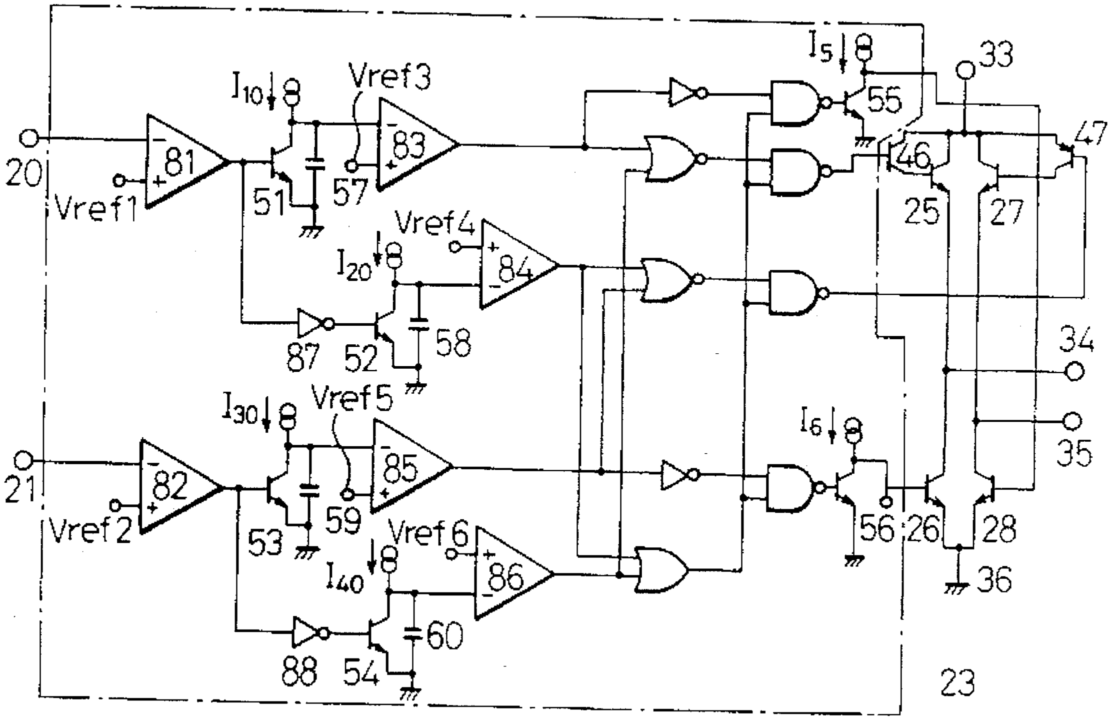
FIG. 8 is a block diagram illustrating in detail the circuit FIG. 1.

FIG. 8 is a diagram which concretely illustrates the circuit of FIG. 1, and wherein the same elements and the same circuit blocks are denoted by the same reference numerals. Here, however, the diodes 29 to 32 are not shown. A comparator 81 is connected to the signal input terminal 20, a comparator 82 is connected to the signal input terminal 21, and transistors 51, 53 and inverters 87, 88 constituted by transistors are connected to the above comparators, and their outputs are connected to the transistors 52 and 54. Constant-current sources set to $I_{10}$, $I_{20}$, $I_{30}$ and $I_{40}$, and capacitors 57, 58, 59 and 60 are connected to the collectors of the transistors 51, 52, 53 and 54, respectively and are further connected to the comparators 83 to 86. These comparators are connected via logic circuits to transistors 46, 25, 26, 28, 27 and 47 which together constitute the output circuit.

In the present invention, the comparators 81 and 82 are operated by potentials that are input to the inverters 87 and 88. When, for example, the transistor 53 is changed over from the turned-on state to the turned-off state due to a change in the output, the capacitor 59 is electrically charged with $I_{30}$. However, the threshold voltage of the comparator 85 is not reached until the time, $$t_d = C_{59} * V_{ref5} / I_{30} \quad (1)$$

where $C_{59}$ is a capacity of the capacitor 59 and $V_{ref5}$ is a threshold value of the comparator 85, such that a delay occurs. After the passage of the time $t_d$, therefore, the comparator 85 connected to the next stage is operated and a signal is transmitted to the logic circuit.

According to the present invention, a time difference is created between the signals input to the logic circuit block by utilizing a delay created by the capacitor which is electrically charged with a constant current. The current-feeding transistors and the output transistors that are connected together through wiring are thus prevented from being simultaneously turned on by delaying the time when the current-feeding transistor 25 or 27 is changed over from the off state to the on state or at the time when the output transistor 26 or 28 is changed over from the off state to the on state.

The logic will now be concretely described. Table 1 shows relationships between the input signals and the output signals.

TABLE 1

| SIGNAL INPUT TERMINALS | | OUTPUT TRANSISTORS | | | |
|---|---|---|---|---|---|
| 20 | 21 | 25 | 26 | 27 | 28 |
| H | H | OFF | ON | OFF | ON |
| H | L | ON | OFF | OFF | ON |
| L | H | OFF | ON | ON | OFF |
| L | L | OFF | OFF | OFF | OFF |

Considering the output transistor 26 in this case, when the input terminal 21 changes from L to H, a delay $t_d$ is produced by the capacitor 59 and the comparator 85, so that the output transistor 26 is turned on. Considering the output transistor 25, furthermore, when the input terminal 21 changes from H to L, a delay $t_d$ is produced by the capacitor 60 and the comparator 86, so that the output transistor 25 is turned on. Thus, the output transistors 25 and 26 can be simultaneously turned off. By employing the constitution of the present invention as described above, current is prevented from flowing through the integrated circuit chip, and a favorable semiconductor integrated circuit is provided.

Figure 9:
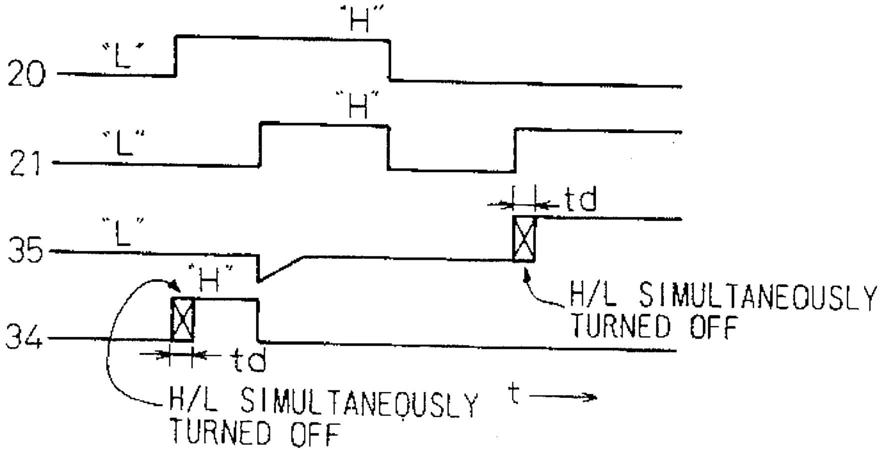
FIG. 9 is a timing chart illustrating input and output relationships in the circuit of FIG. 8.

FIG. 9 illustrates input and output waveforms when the circuit of FIG. 8 is employed, and illustrates the output waveforms at the output terminals 34 and 35 relative to the input waveforms at the signal input terminals 20 and 21, wherein the abscissa represents the time. During the period of time $t_d$ in FIG. 9, the current-feeding transistor and the output transistor can be simultaneously turned off.

Figure 10:
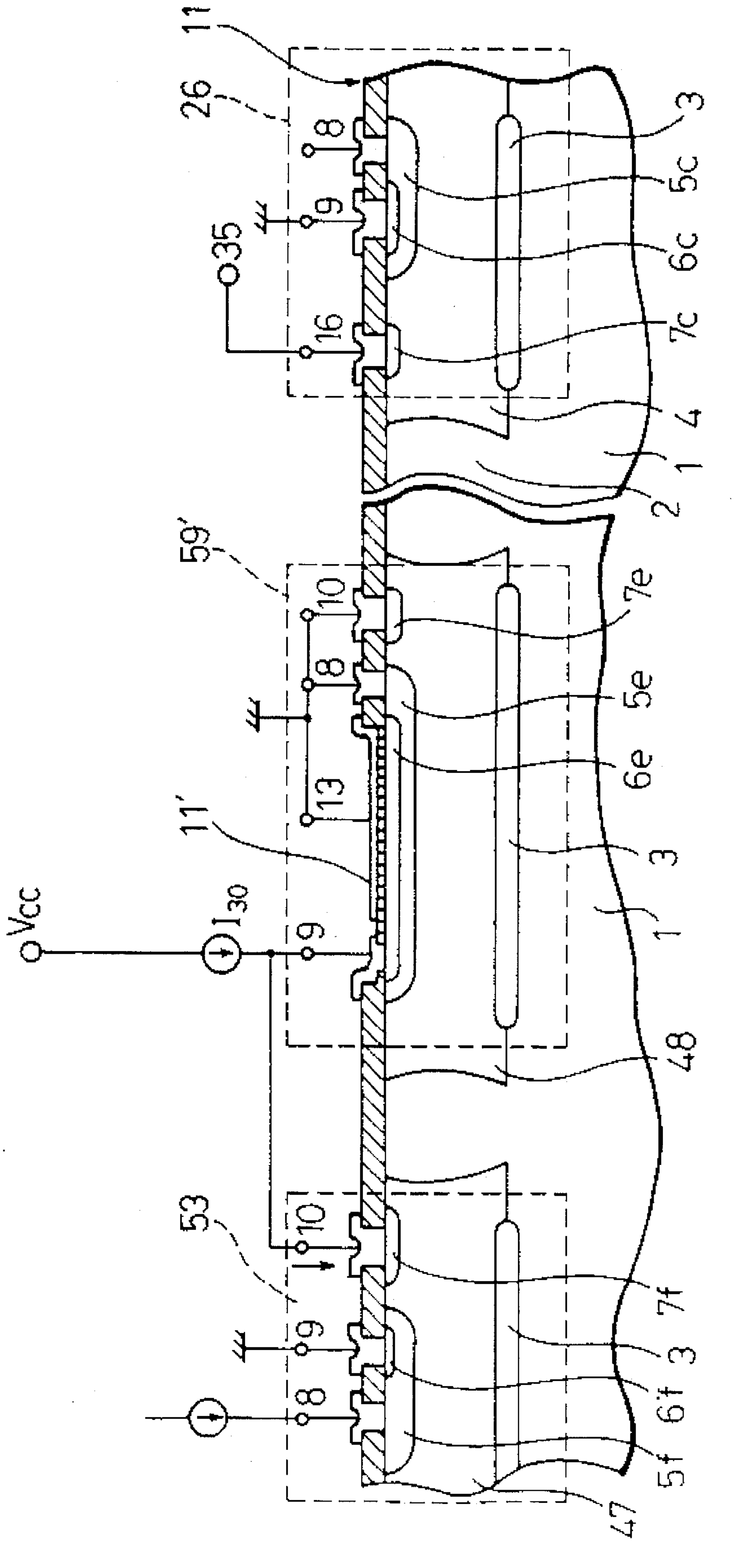
FIG. 10 is a diagram illustrating, in cross section, the constitution of the embodiment of the present invention.

FIG. 10 is a diagram which schematically illustrates in cross section an embodiment in which a capacitor is formed in order to generate the delay mentioned above. FIG. 10 specifically illustrates the transistor 53, capacitor 59, transistor 59' and output transistor 26 shown in FIG. 8. Reference numeral 1 denotes a p-type substrate. Output transistors 26, 59' and 53 having bases 5c, 5e and 5f which are P-type diffusion regions, emitters 6c, 6e and 6f formed by N+-type diffusion and collectors 7c, 7e and 7f formed by N+-type diffusion respectively formed in the N-type epitaxial layer on the N-type buried layers 3 and separated by isolation layer 2.

The constant-current source $I_{30}$ is connected to the emitter 6e of the transistor 59', the collector 7e and the base 5e are connected together and are grounded, and a capacitor is formed by utilizing the PN-junction capacity of the base 5e and emitter 6e in the inverse-bias junction.

A hatched region 11' of a thin oxide film is formed on the emitter 6e of the transistor 59' and a wiring member that is grounded is provided thereon to form a MOS-type capacity in addition to the PN-junction capacity. This makes it possible to obtain the desired capacitance with a small transistor area. The PN-junction capacity is only enough to be used when the capacitance is relatively small. A capacitor having the PN-junction capacity corresponds to the capacitor 59 of FIG. 8, and produces a delay as it is charged with the constant-current source $I_{30}$. The capacitance is smaller than about 100 pF, and a current of the constant-current source $I_{30}$ as small as 10 μA or less is sufficient create a delay of about 100 μsec.

When a capacitor is formed by the transistor 59' as described above, a current is drawn from the output terminal 35 upon the application of a negative potential to the output terminal 35. In the transistor 59' of which the collector is grounded, however, the current is drawn from ground and the capacitor is not at all affected. Therefore, a stable delay time $t_d$ is always provided.

In practice, in the circuit shown in FIG. 8, the constant current $I_{30}$ fed to the capacitor is also fed to the transistor 53. Therefore, there may occur a parasitic transistor having the epitaxial layer region 47 of the transistor 53 as the collector. Even when the capacitor is formed by the transistor 59', the device is likely to be affected by other elements. In order to suppress such an effect, a detection circuit for detecting a parasitic current is constituted and a current that corresponds to the parasitic current detected by this circuit is fed to the collector which is an output terminal of the transistor 53. In practice, a current according to this embodiment mirror circuit is constituted as shown in FIG. 11.

Figure 11:
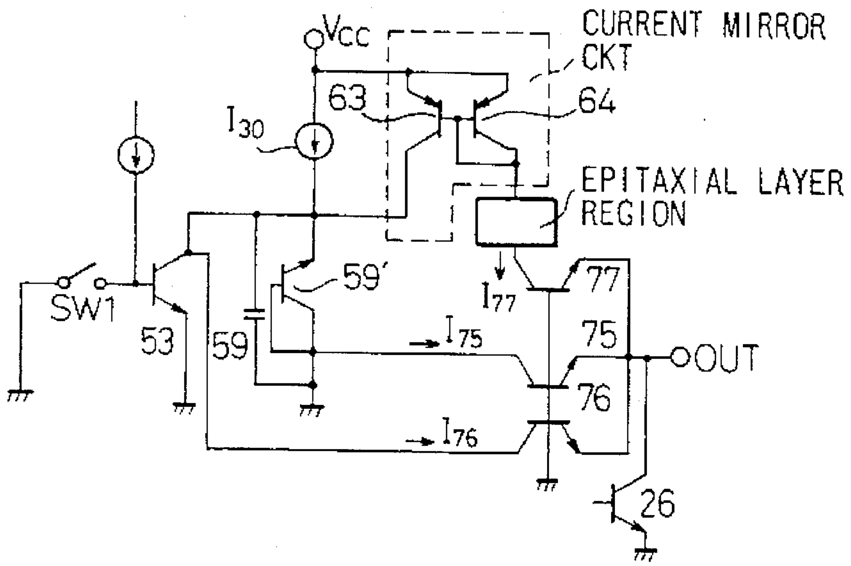
FIG. 11 is a diagram of an equivalent circuit of FIG. 10.

Referring to FIG. 11, the current mirror circuit is constituted by PNP transistors 63 and 64 formed in the integrated circuit chip. The collector and base of the transistor 64 of the input side are connected to the epitaxial layer region formed near the transistor 53 though not shown in FIG. 10, and the collector of the transistor 63 of the output side is connected to the emitter 6f of the transistor 53.

The epitaxial layer region near the transistor 53 has a collector formed by N+-type diffusion having a length equal to the length of the collector of the output transistor 26. Here, the width of region near the transistor 53 is in a range in which the parasitic collector current is nearly the same when the length of the collector is equal. Concretely speaking, when the transistor 61 of FIG. 5 as regarded as the transistor 53, this region exists nearer to the transistor 53 than the center between the transistor 53 and the transistor 26.

FIG. 11 is a diagram of an equivalent circuit for preventing the effect of the parasitic transistor. When a current is drawn from the output terminal 35 upon the application of a negative potential to the output terminal 35, there is formed a parasitic NPN transistor 76 in which the epitaxial region 4 of the output transistor 26 shown in FIG. 10 works as an emitter, the grounded isolation layer 2 works as a base and the collector region 47 of the transistor 53 works as a collector. A parasitic NPN transistor 75 is formed in which the collector region 48 of the transistor 59' works as a collector, and a parasitic NPN transistor 77 is also formed in which the epitaxial layer region to which is connected the transistor of the output side of the current mirror circuit works as a collector. In this case, the parasitic transistor 75 draws current from ground as mentioned above, but no problem occurs in the circuit. The parasitic transistor 76, however, draws the current from the constant-current source $I_{30}$, thereby causing a problem. When the current mirror circuit is constituted as described above, therefore, the parasitic collector currents $I_{76}$ and $I_{77}$ of the parasitic transistors 76 and 77, respectively, become equal to each other since the opposing lengths of their collectors are the same with respect to the output transistor 26. That is, since the parasitic current $I_{76}$ that is drawn is equal to the current $I_{77}$ that is fed via the current mirror circuit, the current fed to the transistor 53 remains unchanged despite the parasitic transistor being operated. This makes it possible to completely remove the effect of parasitic current $I_{76}$ caused by the application of a negative voltage to the terminal.

As will be understood from the above description, the current mirror circuit exhibits its effect even in a circuit in which no capacitor has been formed. That is, even in the case of FIG. 3, the current mirror circuit can be added to the control transistor 61 to directly detect the parasitic current and to remove its effect. This is the case where the output side of the control transistor 61 is the collector. As described above, the parasitic effect can be canceled by feeding a current that corresponds to the parasitic current to the output side of either the collectors or the emitters of a plurality of control transistors.

Summarizing the foregoing, it is necessary, as shown in FIG. 4, to shorten the length of the collectors and to feed a constant current larger than the parasitic current that may be generated to eliminate the occurrence of erroneous operation. By adding a current mirror circuit such as that shown in FIG. 11, furthermore, there is no need to consider the effect of parasitic current and it is possible to decrease the amount of current consumed by an integrated circuit.

We claim:

1. A bipolar semiconductor integrated circuit formed on an integrated circuit chip comprising:

an output circuit portion having output-stage transistors;

a control circuit portion having control transistors, for controlling the output circuit portion, at least one of said control transistors being formed in an elongated shape having a short side and a long side; and a PN-junction isolation region formed on said integrated circuit chip such that said output-stage transistors are isolated from said control transistors by said isolation region;

said at least one control transistor formed in an elongated shape being arranged on said integrated circuit chip such that said short side is oriented toward said output-stage transistors.

2. A bipolar semiconductor integrated circuit according to claim 1, wherein said output-stage transistors are formed in an elongated shape, having a first side oriented toward at least one of said control transistors, two adjacent sides and a second side opposite to said first side, said bipolar semiconductor integrated circuit further comprising a region formed in said integrated circuit chip such that at least said first side and said two adjacent sides of said output-stage transistors are surrounded by said region, said region being a parasitic collector of a parasitic transistor, said PN-junction isolation region being a base of said parasitic transistor, and a control transistor region of said at least one control transistor being an emitter of said parasitic transistor, such that a parasitic current flows from said PN-junction isolation region to said control transistor region.

3. A bipolar semiconductor integrated circuit according to claim 1, wherein said control circuit portion includes a capacitor, said capacitor being an NPN transistor having a PN-junction capacity between a base and an emitter thereof, a collector and said base of said NPN transistor being short-circuited, said collector being formed in said integrated circuit chip adjacent to said PN-junction isolation region.

4. A bipolar semiconductor integrated circuit according to claim 3, wherein said output circuit portion includes current-feeding transistors for feeding currents to the output-stage transistors, emitters of said current-feeding transistors being connected to collectors of respective ones of said output-stage transistors, said output-stage transistors and said current-feeding transistors being inhibited from being simultaneously turned on by said control circuit transistors by utilizing a charging time of said capacitor formed in said control circuit portion.

5. A bipolar semiconductor integrated circuit formed on an integrated circuit chip comprising:

output-stage transistors;

control transistors for controlling said output-stage transistors, said control transistors being formed on said integrated circuit chip;

a PN-junction isolation region formed in said integrated circuit chip between said control transistors and said output stage transistors; and parasitic current detection means for detecting a parasitic current that is generated between the output-stage transistors and the control transistors, and for feeding a current corresponding to the parasitic current to an output side of the control transistors in order to cancel the parasitic current.

6. A bipolar semiconductor integrated circuit according to claim 5, further comprising a semiconductor region, which is formed near said control transistors and from which a detected current flows to the output-stage transistors as said parasitic current, said parasitic current detection means including a current mirror circuit for feeding a current equal to the detected current to the output side of said control transistors.

7. A bipolar semiconductor integrated circuit comprising:

a semiconductor substrate of a first conductive type;

a semiconductor layer of a second conductive type formed on a surface of the semiconductor substrate, the semiconductor layer having a first major surface adjacent to the surface of the semiconductor substrate, and a second major surface being opposite to the first major surface;

an isolation region of the first conductive type extending from the second major surface of the semiconductor layer to the semiconductor substrate;

element regions formed in the semiconductor layer and isolated from each other by the isolation region;

output-stage transistors formed in first regions of the element regions; and control transistors, formed in second regions of the element regions different from the first regions, at least one of the second regions being formed in an elongated shape and having a short side of the elongated shape arranged toward at least one of the output-stage transistors.

8. A bipolar semiconductor integrated circuit according to claim 7, wherein:

each of the output-stage transistors are formed in a respective one of the first regions, and include:

a first collector of the second conductive type, a first base of the first conductive type, and a first emitter of the second conductive type formed in the first base; and each of the control transistors are formed in a respective one of the second regions and include:

a second collector of the second conductive type, a second base of the first conductive type, and a second emitter of the second conductive type formed in the second base.

9. A bipolar semiconductor integrated circuit according to claim 8, wherein when a forward bias is applied to a PN-junction formed between the isolation region and at least one of the first regions, a parasitic transistor, having at least one of the second regions as a collector, the isolation region as a base and the at least one of the first regions as an emitter, is formed to flow a parasitic current between the at least one of the second regions and the at least one of the first regions.

10. A bipolar semiconductor integrated circuit according to claim 9, wherein the control transistors control the output-stage transistors.

11. A bipolar semiconductor integrated circuit according to claim 10, wherein the parasitic transistor is formed when the output-stage transistors control a motor.

12. A bipolar semiconductor integrated circuit according to claim 8, further comprising:

third regions of the element regions, different from the first regions and the second regions, the first regions being formed in an elongated shape having a first side oriented toward at least one of the second regions, two adjacent sides, and a side opposite to the first side, the first side of each of the first regions also oriented toward a respective one of the third regions, wherein when a forward bias is applied to a PN-junction formed between the isolation region and at least one of the first regions, a parasitic transistor is formed, the parasitic transistor having the respective one of the third regions as a collector, the isolation region as a base, and the at least one of the first regions as a collector.

13. A bipolar semiconductor integrated circuit according to claim 8, further comprising a capacitor formed in a third region of the element regions, the capacitor having:

a collector region of the second conductive type, a base region of the first conductive type, the base region being terminated on a surface of the third region, and an emitter region of the second conductive type, the emitter region being terminated on a surface of the base region, the collector region and the base region being short-circuited, the emitter region being a first electrode of the capacitor, the base region being a second electrode of the capacitor, a PN-junction formed between the emitter region and the base region providing a capacity of the capacitor.

14. A bipolar semiconductor integrated circuit according to claim 13, further comprising current-feeding transistors for feeding currents to the output-stage transistors, formed in fourth regions of the element regions, an emitter of each of the current-feeding transistors being connected to the first collector of a respective one of the output-stage transistors, the output-stage transistors and the current-feeding transistors being inhibited from being simultaneously turned on by utilizing a charging time of the capacitor formed in the third region.

15. A bipolar semiconductor integrated circuit formed on an integrated circuit chip, comprising:

an output-stage transistor region having output-stage transistors;

a control transistor region having control transistors for controlling the output-stage transistors;

an isolation region, the control transistors being isolated from the output-stage transistors by a PN-junction formed between the control transistor region and the isolation region;

at least one parasitic transistor formed between the control transistors and the output-stage transistors, the parasitic transistor drawing a parasitic current from the control transistors;

a parasitic current detection means for detecting the parasitic current, and for feeding a current corresponding to the parasitic current to the control transistors in order to cancel the parasitic current.

* * * * *